United States Patent
Meng et al.

(10) Patent No.: US 11,087,982 B2
(45) Date of Patent: Aug. 10, 2021

(54) METHOD AND SYSTEM FOR FABRICATING A SEMICONDUCTOR DEVICE

(71) Applicant: WUHAN CHINA STAR OPTOELECTRONICS SEMICONDUCTOR DISPLAY TECHNOLOGY CO., LTD., Hubei (CN)

(72) Inventors: Yuanming Meng, Hubei (CN); Yu Yan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/620,503

(22) PCT Filed: May 14, 2019

(86) PCT No.: PCT/CN2019/086766
§ 371 (c)(1),
(2) Date: Dec. 8, 2019

(87) PCT Pub. No.: WO2020/151132
PCT Pub. Date: Jul. 30, 2020

(65) Prior Publication Data
US 2021/0013036 A1  Jan. 14, 2021

(30) Foreign Application Priority Data

Jan. 21, 2019  (CN) .......................... 201910055441.4

(51) Int. Cl.
*H01L 21/02* (2006.01)
*H01L 21/306* (2006.01)
(Continued)

(52) U.S. Cl.
CPC ...... *H01L 21/02675* (2013.01); *C23C 16/483* (2013.01); *C30B 1/02* (2013.01);
(Continued)

(58) Field of Classification Search
None
See application file for complete search history.

(56) References Cited

U.S. PATENT DOCUMENTS

| 2004/0171236 A1* | 9/2004 | Shih ................ H01L 29/66757 438/478 |
| 2010/0112821 A1* | 5/2010 | Itano ................ H01L 21/31053 438/745 |
| 2014/0057419 A1 | 2/2014 | Tian et al. |

FOREIGN PATENT DOCUMENTS

| CN | 1487344 A | 4/2004 |
| CN | 1540719 A | 10/2004 |

(Continued)

*Primary Examiner* — Asok K Sarkar
(74) *Attorney, Agent, or Firm* — Mark M. Friedman

(57) ABSTRACT

The present disclosure provides a method and system for fabricating a semiconductor device. The method and system of the present disclosure, after obtaining the polysilicon layer, first form the protective oxide layer on the surface of the polysilicon layer, and then etch the protective oxide layer and the protrusions on the surface of the polysilicon layer with the buffered oxide etchant based on controllability of the buffered oxide etchant, thereby reducing the protrusions on the surface of the polysilicon layer, while well protecting the surface of the polysilicon layer. Therefore, the technical problem of surface roughness in the existing polysilicon layers is solved.

14 Claims, 2 Drawing Sheets

(51) Int. Cl.
*C23C 16/48* (2006.01)
*C30B 1/02* (2006.01)

(52) U.S. Cl.
CPC .. *H01L 21/02532* (2013.01); *H01L 21/02595* (2013.01); *H01L 21/306* (2013.01)

(56) References Cited

FOREIGN PATENT DOCUMENTS

| | | |
|---|---|---|
| CN | 102651311 A | 8/2012 |
| CN | 102655089 A | 9/2012 |
| JP | H0832075 A | 2/1996 |

\* cited by examiner

METHOD AND SYSTEM FOR FABRICATING A SEMICONDUCTOR DEVICE

FIELD OF INVENTION

The present disclosure relates to a field of semiconductor device fabrication, and particularly to a method and system for fabricating a semiconductor device.

BACKGROUND

With development of technology, silicon materials, especially polysilicon, are playing an increasingly important role in the field of semiconductors based on their doping characteristics.

In the prior art, a polysilicon layer is generally obtained by processing amorphous silicon. At this time, there are protrusions on a surface of the polysilicon layer, and these protrusions cause the surface of the polysilicon layer to be rough. Surface roughness of the polysilicon layer is generally between 10 nm and 20 nm, which will reduce a breakdown electric field of a semiconductor device and increase a leakage current of the semiconductor device. A doubling of the surface roughness increases the leakage current by two orders of magnitude.

That is, in the existing polysilicon layers, there is a technical problem of surface roughness.

SUMMARY OF DISCLOSURE

The present disclosure provides a method and system for fabricating a semiconductor device in order to solve the technical problem of surface roughness in the existing polysilicon layers.

The present disclosure provides a method for fabricating a semiconductor device, comprising:
  depositing a polysilicon layer on a device layer;
  forming an oxide layer on a surface of the polysilicon layer, the oxide layer covering protrusions on the surface of the polysilicon layer;
  etching the oxide layer with a buffered oxide etchant; and
  forming a functional layer on the surface of the polysilicon layer obtained by etching to obtain the semiconductor device.

In the method of the present disclosure, the forming the oxide layer on the surface of the polysilicon layer comprises: depositing an oxide on the surface of the polysilicon layer by chemical vapor deposition to form the oxide layer.

In the method of the present disclosure, the depositing the oxide on the surface of the polysilicon layer comprises: depositing silicon oxide on the surface of the polysilicon layer.

In the method of the present disclosure, the depositing the polysilicon layer on the device layer comprises: forming an amorphous silicon layer on the device layer, and processing the amorphous silicon layer by excimer laser annealing to form the polysilicon layer.

In the method of the present disclosure, the forming the oxide layer on the surface of the polysilicon layer comprises: forming an oxide layer having a thickness of 20 nm on the surface of the polysilicon layer.

In the method of the present disclosure, the etching the oxide layer with the buffered oxide etchant comprises: providing the buffered oxide etchant, and immersing the device layer, on which the oxide layer is formed, in the buffered oxide etchant for a predetermined time and then taking it out.

In the method of the present disclosure, the providing the buffered oxide etchant comprises: providing a buffered hydrofluoric acid etchant.

In the method of the present disclosure, the providing the buffered hydrofluoric acid etchant comprises: mixing hydrofluoric acid, ammonium fluoride, and water to obtain the buffered hydrofluoric acid etchant.

In the method of the present disclosure, the mixing hydrofluoric acid, ammonium fluoride, and water to obtain the buffered hydrofluoric acid etchant comprises: mixing a hydrofluoric acid aqueous solution having a molar ratio of 40% and an ammonium fluoride aqueous solution having a molar ratio of 50% at a volume ratio of 1:7 to obtain the buffered hydrofluoric acid etchant.

In the method of the present disclosure, the immersing the device layer, on which the oxide layer is formed, in the buffered oxide etchant for a predetermined time and then taking it out comprises: immersing the device layer, on which the oxide layer is formed, in the buffered oxide etchant for two seconds and then taking it out.

The present disclosure provides a system for fabricating a semiconductor device, comprising:
  a deposition member for depositing a polysilicon layer on a device layer;
  an oxide member for forming an oxide layer on a surface of the polysilicon layer;
  an etching member for etching the oxide layer with a buffered oxide etchant; and
  a formation member for forming a functional layer on the surface of the polycrystalline silicon layer obtained by etching to obtain the semiconductor device.

In the system of the present disclosure, the deposition member comprises:
  a providing module for providing the device layer that needs to deposit the polysilicon layer;
  an amorphous silicon module for forming an amorphous silicon layer on the device layer; and
  a polysilicon module for processing the amorphous silicon layer to form the polysilicon layer.

In the system of the present disclosure, the oxide member is configured for depositing an oxide on the surface of the polysilicon layer by chemical vapor deposition to form the oxide layer that covers protrusions on the surface of the polysilicon layer.

In the system of the present disclosure, the oxide member is configured for depositing silicon oxide on the surface of the polysilicon layer.

In the system of the present disclosure, the oxide member is configured for forming an oxide layer having a thickness of 20 nm on the surface of the polysilicon layer.

In the system of the present disclosure, the oxide member is configured for forming an oxide layer having a thickness greater than 20 nm on the surface of the polysilicon layer.

In the system of the present disclosure, the etching member comprises:
  a providing module for providing the buffered oxide etchant; and
  an immersion module for immersing the device layer, on which the oxide layer is formed, in the buffered oxide etchant for a predetermined time and then taking it out.

In the system of the present disclosure, the providing module is configured for: providing a buffered hydrofluoric acid etchant.

In the system of the present disclosure, the providing module is configured for: mixing hydrofluoric acid, ammonium fluoride and, water to obtain the buffered hydrofluoric acid etchant.

In the system of the present disclosure, the providing module is configured for: mixing a hydrofluoric acid aqueous solution having a molar ratio of 40% and an ammonium fluoride aqueous solution having a molar ratio of 50% at a volume ratio of 1:7 to obtain the buffered hydrofluoric acid etchant.

The present disclosure provides a new method and system for fabricating a semiconductor device, comprising: depositing a polysilicon layer on a device layer; forming an oxide layer on a surface of the polysilicon layer, the oxide layer covering protrusions on the surface of the polysilicon layer; etching the oxide layer with a buffered oxide etchant; and forming a functional layer on the surface of the polysilicon layer obtained by etching to obtain the semiconductor device. The method and system of the present disclosure, after obtaining the polysilicon layer, first form the protective oxide layer on the surface of the polysilicon layer, and then etch the protective oxide layer and the protrusions on the surface of the polysilicon layer with the buffered oxide etchant based on controllability of the buffered oxide etchant, thereby reducing the protrusions on the surface of the polysilicon layer, while well protecting the surface of the polysilicon layer. Therefore, the technical problem of surface roughness in the existing polysilicon layers is solved.

BRIEF DESCRIPTION OF DRAWINGS

In order to more clearly illustrate the technical solutions in the embodiments of the present disclosure, a brief description of accompanying drawings used in the description of the embodiments of the present disclosure will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
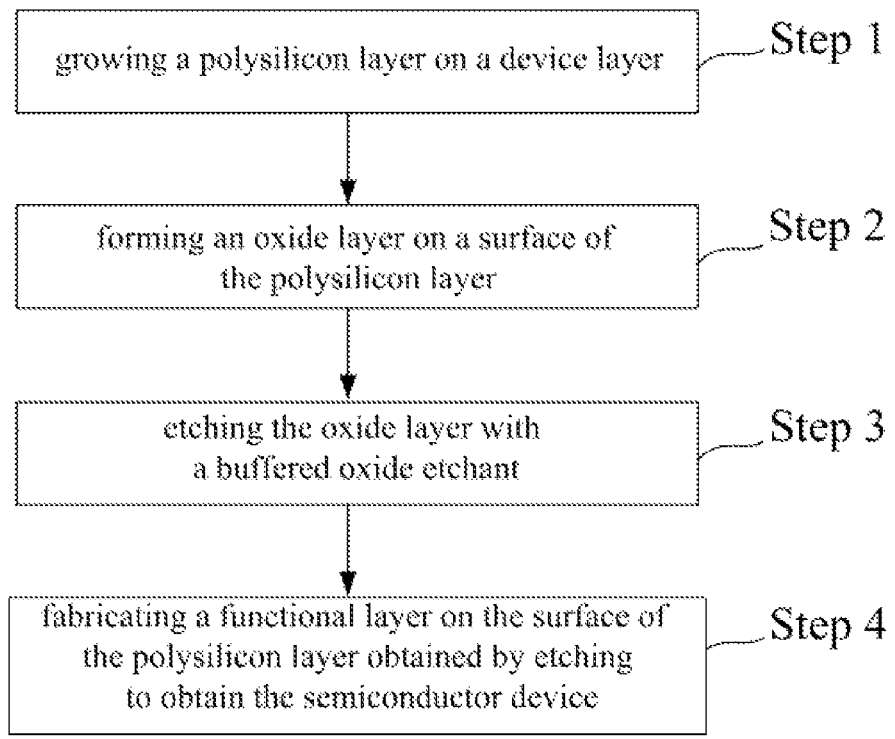
FIG. 1 is a process flow diagram of a method for fabricating a semiconductor device according to an embodiment of the present disclosure.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", etc., are merely used to indicate the direction of the accompanying drawings. Therefore, the directional terms are used for illustrating and understanding the present disclosure rather than limiting the present disclosure. In the figures, elements with similar structure are indicated by the same reference numerals.

The embodiments of the present disclosure can solve the technical problem of surface roughness in the existing polysilicon layers.

As shown in FIG. 1, an embodiment of the present disclosure provides a method for fabricating a semiconductor device, comprising:

Step 1: depositing a polysilicon layer on a device layer.

Figure 2A:
FIG. 2 is a schematic diagram of a process for fabricating a semiconductor device according to an embodiment of the present disclosure.
Figure 2B:
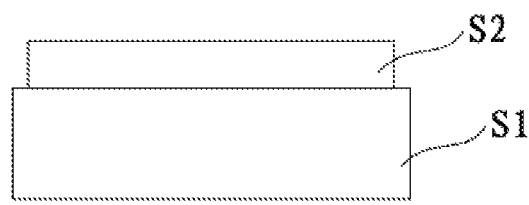
Figure 2C:
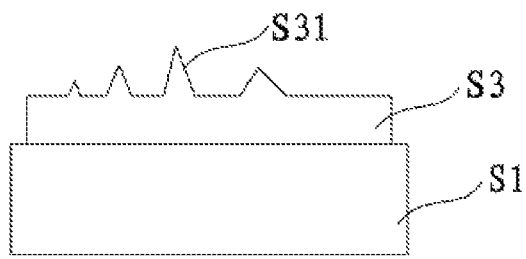

In an embodiment, Step 1 comprises:

as shown in FIG. 2A, providing a device layer S1, such as a glass substrate, that needs to deposit the polysilicon layer;

as shown in FIG. 2B, forming an amorphous silicon layer S2 on the device layer S1; and as shown in FIG. 2C, processing the amorphous silicon layer S2 by a process such as excimer laser annealing (ELA) to form the polysilicon layer S3.

Step 2: forming an oxide layer on a surface of the polysilicon layer.

Figure 2D:
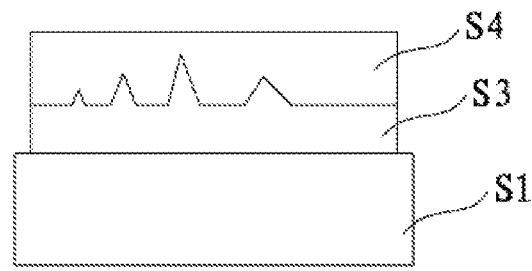

In an embodiment, Step 2 comprises:

as shown in FIG. 2D, depositing an oxide on the surface of the polysilicon layer S3 by chemical vapor deposition (CVD) to form the oxide layer S4 that covers protrusions S31 on the surface of the polysilicon layer S3. The oxide layer S4 formed by CVD is compact and has a good density, so that uniformity of etching rate can be maintained during etching.

In an embodiment, the depositing the oxide on the surface of the polysilicon layer S3 comprises: depositing silicon oxide on the surface of the polysilicon layer S3. This is because silicon oxide has a relatively low cost and is easy to etch.

In an embodiment, the forming the oxide layer S4 on the surface of the polysilicon layer S3 comprises: forming an oxide layer S4 having a thickness of 20 nm on the surface of the polysilicon layer S3. This is because a protrusion S31 having a height of 20 nm may appear on the surface of the polysilicon layer S3, and the oxide layer S4 can completely cover the protrusion S31.

In an embodiment, the forming the oxide layer S4 on the surface of the polysilicon layer S3 comprises: forming an oxide layer S4 having a thickness greater than 20 nm on the surface of the polysilicon layer S3. This is because a protrusion S31 having a height of 20 nm may appear on the surface of the polysilicon layer S3, and the oxide layer S4 can completely cover the protrusion S31.

Step 3: etching the oxide layer with a buffered oxide etchant.

Figure 2E:
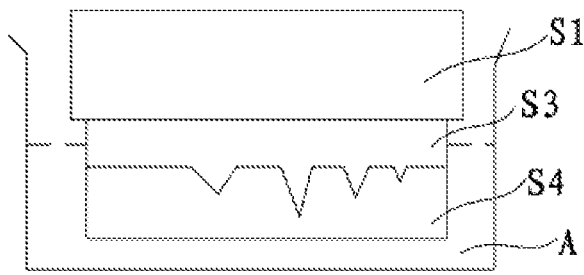
Figure 2F:
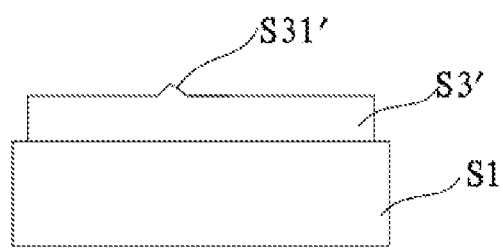

In an embodiment, Step 3 comprises:

providing the buffered oxide etchant A; and as shown in FIG. 2E, immersing the device layer S1, on which the oxide layer S4 is formed, in the buffered oxide etchant A for a predetermined time t to obtain a structural layer as shown in FIG. 2F and then taking it out.

As shown in FIG. 2F, after etching, the oxide layer S4 is etched away to expose the polysilicon layer S3', while the protrusions S31' on the surface of the polysilicon layer S3' is greatly reduced.

In an embodiment, the providing the buffered oxide etchant A comprises: providing a buffered hydrofluoric acid etchant.

In an embodiment, the providing the buffered hydrofluoric acid etchant comprises: mixing hydrofluoric acid, ammonium fluoride, and water to obtain the buffered hydrofluoric acid etchant. Hydrofluoric acid (HF) is used as a main etchant, and ammonium fluoride ($NH_4F$) is used as a buffer. A concentration of [$H^+$] is maintained by $NH_4F$ to keep a constant etching rate.

In an embodiment, the mixing hydrofluoric acid, ammonium fluoride, and water to obtain the buffered hydrofluoric acid etchant comprises: mixing a hydrofluoric acid aqueous solution having a molar ratio of 40% and an ammonium fluoride aqueous solution having a molar ratio of 50% at a volume ratio of 1:7 to obtain the buffered hydrofluoric acid etchant. An etching rate of the buffered hydrofluoric acid etchant provided at such ratio is 10 nm/sec and is moderate.

In an embodiment, the immersing the device layer S1, on which the oxide layer S4 is formed, in the buffered oxide etchant A for a predetermined time and then taking it out comprises: immersing the device layer S1, on which the oxide layer S4 is formed, in the buffered oxide etchant A for two seconds and then taking it out.

Step 4: forming a functional layer on the surface of the polysilicon layer obtained by etching to obtain the semiconductor device.

Figure 2G:
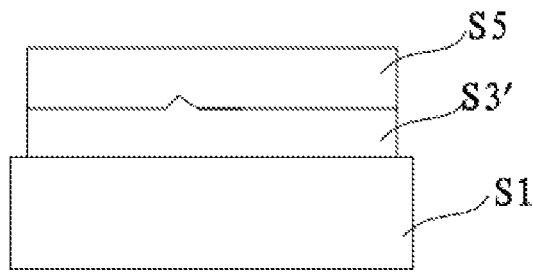

In an embodiment, Step 4 comprises:

cleaning the surface of the polysilicon layer S3' by a neutral solution such as water to remove excess buffered hydrofluoric acid etchant after obtaining the polysilicon layer S3' as shown in FIG. 2F; and as shown in FIG. 2G, forming a functional layer S5 such as an insulating layer and a gate metal layer on the surface of the polysilicon layer S3' obtained by etching to obtain the semiconductor device such as an OLED.

Figure 3:
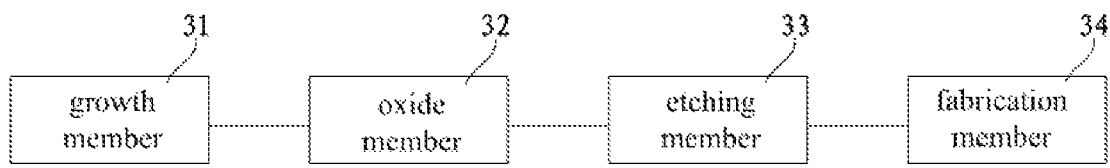
FIG. 3 is a schematic diagram of a system for fabricating a semiconductor device according to an embodiment of the present disclosure.

As shown in FIG. 3, the present disclosure provides a system for fabricating a semiconductor device, which is configured to perform the method shown in FIG. 1. The system comprises:

A deposition member 31 for depositing a polysilicon layer on a device layer.

In an embodiment, the deposition member 31 comprises:

a providing module for providing the device layer S1, such as a glass substrate, that needs to deposit the polysilicon layer, as shown in FIG. 2A;

an amorphous silicon module for forming an amorphous silicon layer S2 on the device layer S1, as shown in FIG. 2B;

a polysilicon module for processing the amorphous silicon layer S2 by a process such as excimer laser annealing (ELA) to form the polysilicon layer S3, as shown in FIG. 2C.

An oxide member 32 for forming an oxide layer on a surface of the polysilicon layer.

In an embodiment, the oxide member 32 is configured for depositing an oxide on the surface of the polysilicon layer S3 by chemical vapor deposition (CVD) to form the oxide layer S4 that covers protrusions S31 on the surface of the polysilicon layer S3, as shown in FIG. 2D. The oxide layer S4 formed by CVD is compact and has a good density, so that uniformity of etching rate can be maintained during etching.

In an embodiment, the oxide member 32 is configured for depositing silicon oxide on the surface of the polysilicon layer S3. This is because silicon oxide has a relatively low cost and is easy to etch.

In an embodiment, the oxide member 32 is configured for forming an oxide layer S4 having a thickness of 20 nm on the surface of the polysilicon layer S3. This is because a protrusion S31 having a height of 20 nm may appear on the surface of the polysilicon layer S3, and the oxide layer S4 can completely cover the protrusion S31.

In an embodiment, the oxide member 32 is configured for forming an oxide layer having a thickness greater than 20 nm on the surface of the polysilicon layer S3. This is because a protrusion S31 having a height of 20 nm may appear on the surface of the polysilicon layer S3, and the oxide layer S4 can completely cover the protrusion S31.

An etching member 33 for etching the oxide layer with a buffered oxide etchant.

In an embodiment, the etching member 33 comprises:

a providing module for providing the buffered oxide etchant A; and an immersion module for immersing the device layer S1, on which the oxide layer S4 is formed, in the buffered oxide etchant A, as shown in FIG. 2E, for a predetermined time t to obtain a structural layer as shown in 2F and then taking it out.

As shown in FIG. 2F, after etching, the oxide layer S4 is etched away to expose the polysilicon layer S3', while the protrusions S31' on the surface of the polysilicon layer S3' is greatly reduced.

In an embodiment, the providing module is configured for: providing a buffered hydrofluoric acid etchant.

In an embodiment, the providing module is configured for: mixing hydrofluoric acid, ammonium fluoride and, water to obtain the buffered hydrofluoric acid etchant. Hydrofluoric acid (HF) is used as a main etchant, and ammonium fluoride ($NH_4F$) is used as a buffer. A concentration of [$H^+$] is maintained by $NH_4F$ to keep a constant etching rate.

In an embodiment, the providing module is configured for: mixing a hydrofluoric acid aqueous solution having a molar ratio of 40% and an ammonium fluoride aqueous solution having a molar ratio of 50% at a volume ratio of 1:7 to obtain the buffered hydrofluoric acid etchant. An etching rate of the buffered hydrofluoric acid etchant provided at such ratio is 10 nm/sec and is moderate.

In an embodiment, an immersion module is configured to immerse the device layer S1, on which the oxide layer S4 is formed, in the buffered oxide etchant A for two seconds and then taking it out.

A formation member 34 for forming a functional layer on the surface of the polycrystalline silicon layer obtained by etching to obtain the semiconductor device.

In an embodiment, the fabrication member 34 is configured to clean the surface of the polysilicon layer S3' by a neutral solution such as water to remove excess buffered hydrofluoric acid etchant after obtaining the polysilicon layer S3' as shown in FIG. 2F; and, as shown in FIG. 2G, forming a functional layer S5 such as an insulating layer and a gate metal layer on the surface of the polysilicon layer S3' obtained by etching to obtain the semiconductor device such as an OLED.

Figure 4:
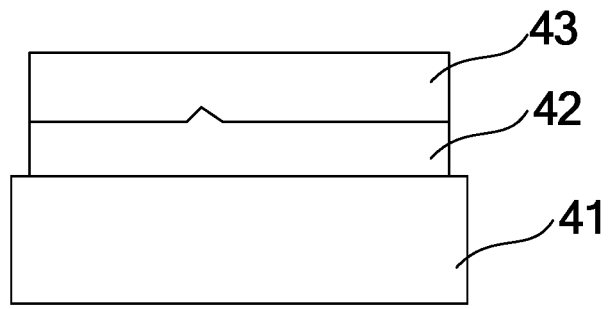
FIG. 4 is a schematic diagram of a semiconductor device according to an embodiment of the present disclosure.

As shown in FIG. 4, the present disclosure provides a semiconductor device, which is obtained by the method shown in FIG. 1. The semiconductor device comprises:

a device layer 41 such as a glass substrate S1;

a polysilicon layer 42 formed on the device layer 41, the polysilicon layer 42 is obtained by etching an oxide layer formed on a surface of the polysilicon layer 42 with a buffered oxide etchant; and a functional layer 43, such as an insulating layer and a gate metal layer, formed on the polysilicon layer 42 to obtain the semiconductor device such as an OLED.

In an embodiment, the polysilicon layer 42 is formed by processing an amorphous silicon layer through a process such as excimer laser annealing (ELA).

In an embodiment, the oxide layer formed on the surface of the polysilicon layer 42 is formed by depositing an oxide on the surface of the polysilicon layer 42 by chemical vapor deposition (CVD). The oxide layer covers protrusions on the surface of the polysilicon layer 42. The oxide layer formed by CVD is compact and has a good density, so that uniformity of etching rate can be maintained during etching.

In an embodiment, the oxide is silicon oxide. This is because silicon oxide has a relatively low cost and is easy to etch.

In an embodiment, the oxide layer has a thickness of 20 nm. This is because a protrusion having a height of 20 nm may appear on the surface of the polysilicon layer 42, and the oxide layer can completely cover the protrusion.

In an embodiment, the oxide layer has a thickness greater than 20 nm. This is because a protrusion having a height of 20 nm may appear on the surface of the polysilicon layer 42, and the oxide layer can completely cover the protrusion.

In an embodiment, the polysilicon layer 42 is obtained by immersing the device layer 41, on which the oxide layer is formed, in the buffered oxide etchant for a predetermined time t and then taking it out.

In an embodiment, the buffered oxide etchant is a buffered hydrofluoric acid etchant.

In an embodiment, the buffered hydrofluoric acid etchant is obtained by mixing hydrofluoric acid, ammonium fluoride, and water. Hydrofluoric acid (HF) is used as a main etchant, and ammonium fluoride ($NH_4F$) is used as a buffer. A concentration of $[H^+]$ is maintained by $NH_4F$ to keep a constant etching rate.

In an embodiment, the buffered hydrofluoric acid etchant is obtained by mixing a hydrofluoric acid aqueous solution having a molar ratio of 40% and an ammonium fluoride aqueous solution having a molar ratio of 50% at a volume ratio of 1:7. An etching rate of the buffered hydrofluoric acid etchant provided at such ratio is 10 nm/sec and is moderate.

In an embodiment, the polysilicon layer 42 is obtained by immersing the device layer 41, on which the oxide layer is formed, in the buffered oxide etchant for two seconds and then taking it out.

In an embodiment, the functional layer 43 is formed on the surface of the polysilicon layer 42 obtained by etching to obtain the semiconductor device.

The present disclosure provides a new method and system for fabricating a semiconductor device, comprising: depositing a polysilicon layer on a device layer; forming an oxide layer on a surface of the polysilicon layer, the oxide layer covering protrusions on the surface of the polysilicon layer; etching the oxide layer with a buffered oxide etchant; and forming a functional layer on the surface of the polysilicon layer obtained by etching to obtain the semiconductor device. The method and system of the present disclosure, after obtaining the polysilicon layer, first form the protective oxide layer on the surface of the polysilicon layer, and then etch the protective oxide layer and the protrusions on the surface of the polysilicon layer with the buffered oxide etchant based on controllability of the buffered oxide etchant, thereby reducing the protrusions on the surface of the polysilicon layer, while well protecting the surface of the polysilicon layer. Therefore, the technical problem of surface roughness in the existing polysilicon layers is solved.

The present disclosure has been disclosed in the above preferred embodiments, but the preferred embodiments are not intended to limit the present disclosure, and those skilled in the art may make various modifications without departing from the scope of the present disclosure. The protective scope of the present disclosure is determined by the claims.

What is claimed is:

1. A method for fabricating a semiconductor device, comprising:
   depositing a polysilicon layer on a device layer;
   forming an oxide layer on a surface of the polysilicon layer, the oxide layer covering protrusions on the surface of the polysilicon layer;
   mixing a hydrofluoric acid aqueous solution having a molar ratio of 40% and an ammonium fluoride aqueous solution having a molar ratio of 50% at a volume ratio of 1:7 to obtain a buffered hydrofluoric acid etchant;
   etching the oxide layer with the buffered hydrofluoric acid etchant; and
   forming a functional layer on the surface of the polysilicon layer obtained by etching to obtain the semiconductor device.

2. The method according to claim 1, wherein the forming the oxide layer on the surface of the polysilicon layer comprises: depositing an oxide on the surface of the polysilicon layer by chemical vapor deposition to form the oxide layer.

3. The method according to claim 2, wherein the depositing the oxide on the surface of the polysilicon layer comprises: depositing silicon oxide on the surface of the polysilicon layer.

4. The method according to claim 1, wherein the depositing the polysilicon layer on the device layer comprises: forming an amorphous silicon layer on the device layer, and processing the amorphous silicon layer by excimer laser annealing to form the polysilicon layer.

5. The method according to claim 4, wherein the forming the oxide layer on the surface of the polysilicon layer comprises: forming an oxide layer having a thickness of 20 nm on the surface of the polysilicon layer.

6. The method according to claim 1, wherein the etching the oxide layer with the buffered hydrofluoric acid etchant comprises: immersing the device layer, on which the oxide layer is formed, in the buffered hydrofluoric acid etchant for a predetermined time and then taking it out.

7. The method according to claim 6, wherein the predetermined time is two seconds.

8. A system for fabricating a semiconductor device, comprising:
   a deposition member for depositing a polysilicon layer on a device layer;
   an oxide member for forming an oxide layer on a surface of the polysilicon layer;
   an etching member for etching the oxide layer with a buffered hydrofluoric acid etchant, which comprises a providing module configured for mixing a hydrofluoric acid aqueous solution having a molar ratio of 40% and an ammonium fluoride aqueous solution having a molar ratio of 50% at a volume ratio of 1:7 to obtain the buffered hydrofluoric acid etchant; and
   a formation member for forming a functional layer on the surface of the polycrystalline silicon layer obtained by etching to obtain the semiconductor device.

9. The system of claim 8, wherein the deposition member comprises:
   a providing module for providing the device layer that the polysilicon layer is deposited on;
   an amorphous silicon module for forming an amorphous silicon layer on the device layer; and
   a polysilicon module for processing the amorphous silicon layer to form the polysilicon layer.

10. The system according to claim 8, wherein the oxide member is configured for depositing an oxide on the surface of the polysilicon layer by chemical vapor deposition to form the oxide layer that covers protrusions on the surface of the polysilicon layer.

11. The system according to claim 10, wherein the oxide member is configured for depositing silicon oxide on the surface of the polysilicon layer.

12. The system according to claim 10, wherein the oxide member is configured for forming an oxide layer having a thickness of 20 nm on the surface of the polysilicon layer.

13. The system according to claim 10 wherein the oxide member is configured for forming an oxide layer having a thickness greater than 20 nm on the surface of the polysilicon layer.

14. The system of claim 8, wherein the etching member further comprises:
an immersion module for immersing the device layer, on which the oxide layer is formed, in the buffered hydrofluoric acid etchant for a predetermined time and then taking it out.

* * * * *